United States Patent [19]
Sim et al.

[11] Patent Number: 5,901,098
[45] Date of Patent: May 4, 1999

[54] GROUND NOISE ISOLATION CIRCUIT FOR SEMICONDUCTOR MEMORY DEVICE AND METHOD THEREOF

[75] Inventors: Jae-Kwang Sim; Sang-Ho Lee, both of Choongcheongbuk-Do, Rep. of Korea

[73] Assignee: LG Semicon Co., Ltd., Cheongju, Rep. of Korea

[21] Appl. No.: 08/885,840

[22] Filed: Jun. 30, 1997

[30] Foreign Application Priority Data

Jan. 7, 1996 [KR] Rep. of Korea ................... 96-26627

[51] Int. Cl.⁶ ................................................. G11C 7/02
[52] U.S. Cl. ..................................... 365/206; 365/207
[58] Field of Search ................................ 365/206, 207, 365/189.05

[56] References Cited

U.S. PATENT DOCUMENTS 5,479,374  12/1995  Kobayashi et al. ................... 365/207
5,617,362   4/1997  Mori et al. ........................ 365/189.05

*Primary Examiner*—David Nelms
*Assistant Examiner*—David Lam
*Attorney, Agent, or Firm*—Fleshner & Kim

[57] ABSTRACT

A semiconductor memory device having a ground noise isolation circuit which prevents the influence of noise which occurs due to ground bouncing which causes erroneous data reading of a memory cell. The ground noise isolation circuit generates a pulse signal having a predetermined width in accordance with a chip enable signal for controlling the output of a data output unit when the data output unit outputs data and by disconnecting a sense amplifier driving transistor during the generation of the pulse signal.

22 Claims, 4 Drawing Sheets

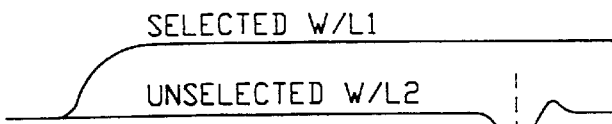
FIG. 2A  W/L
BACKGROUND ART
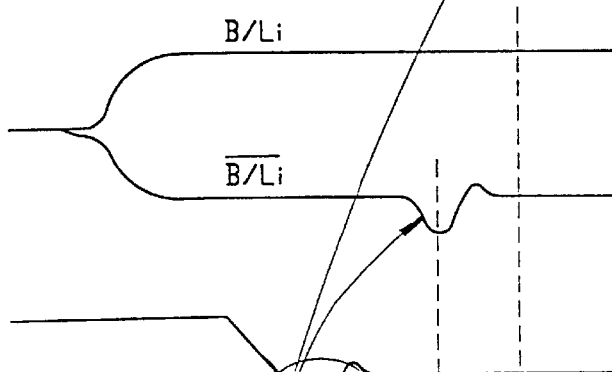
FIG. 2B  B/L
BACKGROUND ART  B̄/L̄
FIG. 2C  DQ
BACKGROUND ART
FIG. 2D  GROUND
BACKGROUND ART  BONDING
WIRE
FIG. 2E  GROUND
BACKGROUND ART
FIG. 2F  GROUND
BACKGROUND ART
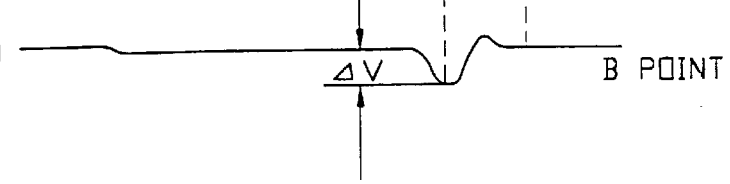

FIG. 4
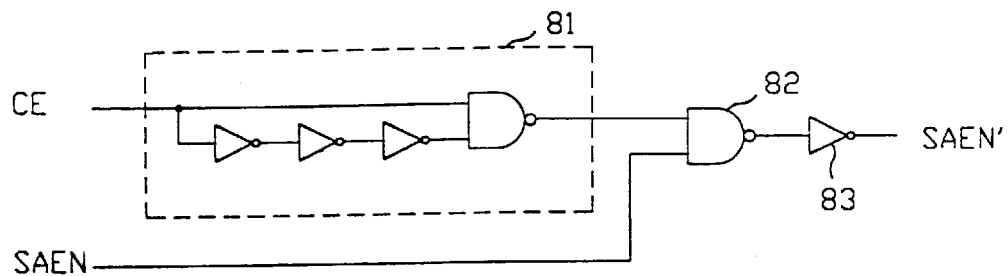
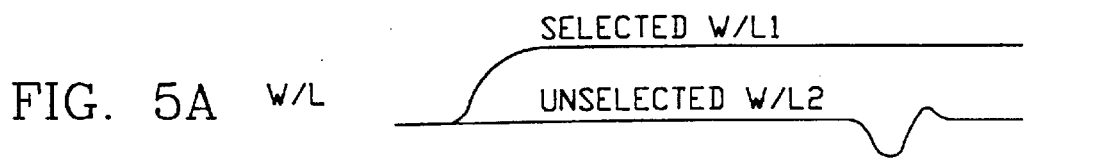
FIG. 5A   W/L
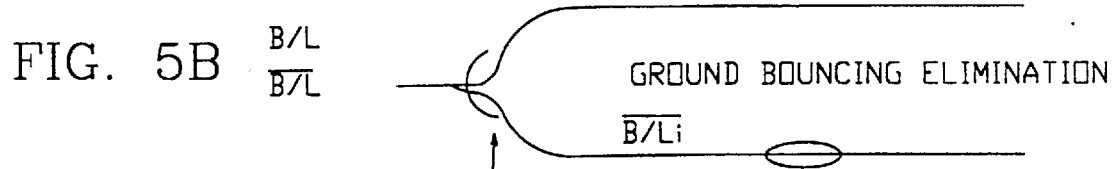
FIG. 5B   B/L
          $\overline{B/L}$
FIG. 5C   CE
FIG. 5D   SAEN'
FIG. 5E   DQ
FIG. 5F   GROUND
FIG. 5G   GROUND

GROUND NOISE ISOLATION CIRCUIT FOR SEMICONDUCTOR MEMORY DEVICE AND METHOD THEREOF

BACKGROUND OF THE INVENTION

1. Field of the Invention

The present invention relates to a semiconductor memory device and a method thereof, and more particularly, to a ground noise isolation circuit for a semiconductor memory device and a method thereof.

2. Background of the Related Art

FIG. 1 is a circuit diagram of a related art semiconductor memory device which includes a cell array 10, with a plurality of word lines W/L and a plurality of bit lines B/L and /B/L which intersect one another and a plurality of memory cells at the intersections. A word line driver 20 is connected to the word lines W/L for driving a specific word line W/L in accordance with a row address RA, and a bit line sense amplifier 30 amplifies the data outputted from the memory cell to a predetermined level in accordance with the driving of a specific word line. A column switch 40 outputs the data amplified by the bit line sense amplifier 30 to input/output lines I/O and /I/O in accordance with a column selection signal CS of a column decoder (not shown). An I/O amplifier 50 amplifies the data outputted through the column switch 40 and a control block 60 outputs a control signal in accordance with the output of the I/O amplifier 50. A data output unit 70 outputs the output of the control block 60 and the data to an output pad PAD in accordance with a chip enable signal CE.

The word line driver 20 includes a plurality of inverters, each of which includes a PMOS transistor 21 and an NMOS transistor 22. The sources of the NMOS transistors 22 are connected to a word line driver ground line 104 through a resistor R2 and the drains are respectively connected to the word lines W/L1 and W/L2. The bit line sense amplifier 30 is connected to a sense amplifier ground line 103 through a sense amplifier enable driving NMOS transistor 101 and a resistor R1.

The data output unit 70 includes NAND-gates 71 and 72 for NANDing control signals from the control block 60 and a chip enabling signal CE. The inverters 73 and 74 respectively invert the outputs of the NAND-gates 71 and 72, and NMOS transistors 75 and 76 are connected in series between a power supply voltage and an output ground line 102, of which its output terminal is connected to the output pad. In addition, the output ground line 102, the sense amplifier ground line 103, and the word line driver ground line 104 are separated so as to reduce noise which occurs due to ground bouncing, and are connected to a ground combining line 105. The reference characters "a" and "b" denote current flow paths to the surge amplifier and word line ground lines 103 and 104.

The related art semiconductor memory device operates as follows with reference to the word lines W/L1 and W/L2 and bit lines B/Li and /B/Li among the plurality of word lines W/L and the plurality of bit lines B/L and /B/L.

When row address inputs Ra1 and Ra2 are at a low level L and a high level H, respectively, the PMOS transistor 21 and the NMOS transistor 22 of the word line driver 20 are turned on, and the word line W/L1, as shown in FIG. 2A, is selected. The data of the memory cell 11 positioned on the selected word line W/L1 is transferred to the bit line B/Li. A sense amplifier enable signal SAEN becomes active, and the sense amplifier driving transistor 101 is turned on. The bit line sense amplifier 30 amplifies the data carried on the bit line B/Li, as shown in FIG. 2B, and the thusly amplified data is outputted to the input/output lines I/O and /I/O through the column switch 40 in accordance with the activated column selection signal CS.

The data carried on the input/output lines I/O and /I/O is amplified by the I/O amplifier 50 and inputted to the data output unit 70 through the control block 60. The NAND-gates 71 and 72 of the data output unit 70 perform a NAND operation on the chip enable signal CE of a high level and the data outputted from the control block 60 and output the results of the inverters 73 and 74. The inverter 73 outputs a low level signal, and the inverter 74 outputs a high level signal to the NMOS transistors 75 and 76, respectively. Accordingly, the data, as shown in FIG. 2C, is outputted to the output pad through the output terminal of the data output unit 70.

However, since the driving capacity of the data output unit 70 is very high, and when the NMOS transistor 76 of which its source is connected to the output ground line 102 is turned on, the output is instantly bounced, as shown in FIG. 2C, in accordance with the virtual inductance of the lead frame. The ground bouncing induces another ground bouncing of the ground combining line 105 through the output ground terminal 102, as shown in FIG. 2D, and the ground bouncing of the ground combining line 105 causes a ground bouncing noise in the sense amplifier ground line 103, and the word line driver ground line 104. Further, in addition, the ground bouncing noise, which occurs in the sense amplifier ground line 103 and the word line driver ground line 104, is inputted to the bit line sense amplifier 30 and the word line driver 20 at a time difference in accordance with the difference between the resistors R1 and R2. The bit line /B/Li at the time t1 is shown in FIG. 2B, and the non-selected word line W/L2 at the time t2 is shown in FIG. 2A.

Therefore, the wave forms at the node "A" of the non-selected word line W/L2 and the node point "B" of the bit line /B/Li are shown in FIGS. 2E and 2F, respectively. The electrical potential difference Vgs at the nodes "A" and "B" at the time t1, i.e., the voltage difference between the gate and source of a transmission transistor of the memory cell 12 is $\Delta V$, as shown in FIG. 2F.

If the electrical potential difference (Vgs=$\Delta V$) between the gate and source of the transmission transistor of the non-selected memory cell 12 is greater than the threshold voltage Vth of the transmission transistor, the non-selected memory cell 12 is turned on parasitically, which cause an erroneous reading or writing of the data of the selected memory cell.

In the related semiconductor memory device, when the data is changed from a high level to a low level by the data output unit due to the noise which occurs by the ground bouncing to affect the bit line through the sense amplifier ground line and sense amplifier, the transmission transistor of the non-selected memory cell may be turned on, thus resulting in erroneous data reading or writing of the memory cell.

The above references are incorporated by reference herein where appropriate for appropriate teachings of additional or alternative details, features and/or technical background.

SUMMARY OF THE INVENTION

Accordingly, an object of the present invention is to overcome the problems of the related art semiconductor memory device.

The objects, features and/or advantages may be achieved by an improved ground noise isolation circuit for a semiconductor memory device and a method thereof which is capable of preventing the influence of noise which occurs due to ground bouncing when outputting a data and the damaging of the data of a memory cell by generating a pulse signal having a predetermined width in accordance with a chip enable signal for controlling the output of a data output unit when the data output unit outputs data and by disconnecting a sense amplifier driving transistor during a pulse generation time.

The present may also be achieved by a ground noise isolation circuit for a semiconductor memory device which receives a sense amplifier enable signal and a chip enable signal, both of which are externally inputted, and generating a pulse signal which compensates the ground bouncing noise by turning off the sense amplifier driving transistor to prevent the ground bouncing noise from effecting the data outputted from the memory cell.

There is also provided a ground noise isolation method for a semiconductor memory device comprising the steps of detecting a ground bouncing noise signal being transferred to a bit line via the sense amplifier driving transistor and the bit line sense amplifier when ground bouncing occurs at the data output unit and controlling the data output unit and the sense amplifier driving transistor by receiving a sense amplifier enable signal and a chip enable signal, both of which are externally inputted, to prevent the ground bouncing noise signal from effecting data being output from the memory cells.

The present invention may be achieved in part or in whole by a memory device, comprising a memory cell array having a plurality of bit lines and word lines and a plurality of memory cells, each cell being coupled to a corresponding word line and a corresponding bit line; a plurality of word line drivers coupled to the plurality of word lines; means for outputting data from a memory cell selected by a corresponding word line from a corresponding bit line to an output pad; a transistor coupled to the outputting means and a first prescribed potential line; and a noise isolation circuit coupled to the transistor such that the transistor is not enabled during a potential bouncing noise on the first prescribed potential line.

The present invention may be achieved in part or in whole by a circuit for preventing a noise from corrupting data from a semiconductor memory cell, comprising a plurality of delay elements connected in series; and a first logic gate coupled to the plurality of delay elements and commonly receiving a first signal; and a second logic gate coupled to the first logic gate and responsive to a second signal such that a pulse signal having a prescribed width which is at least as wide as a width of the noise is generated.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIGS. 2A through 2F are wave forms showing an operational state of each element of FIG. 1 when outputting a data;

FIG. 4 is a detailed circuit diagram of a ground noise isolation circuit of FIG. 3 according to the present invention; and FIGS. 5A through 5G are wave forms showing an operational state of each element of FIG. 3 according to the present invention when outputting data.

DETAILED DESCRIPTION OF PREFERRED EMBODIMENTS

Figure 1:
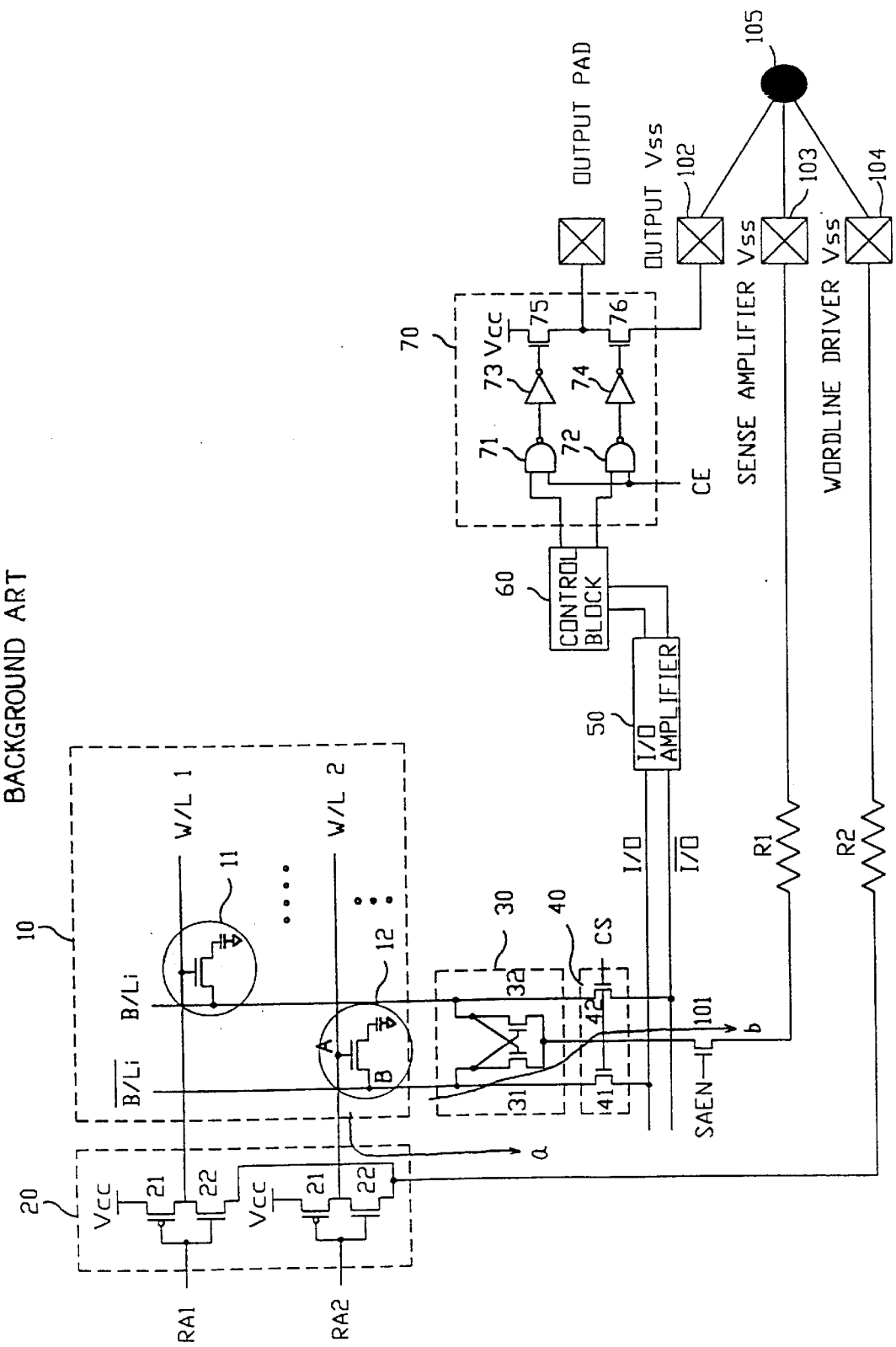
FIG. 1 is a circuit diagram of a related art semiconductor memory device.
Figure 3:
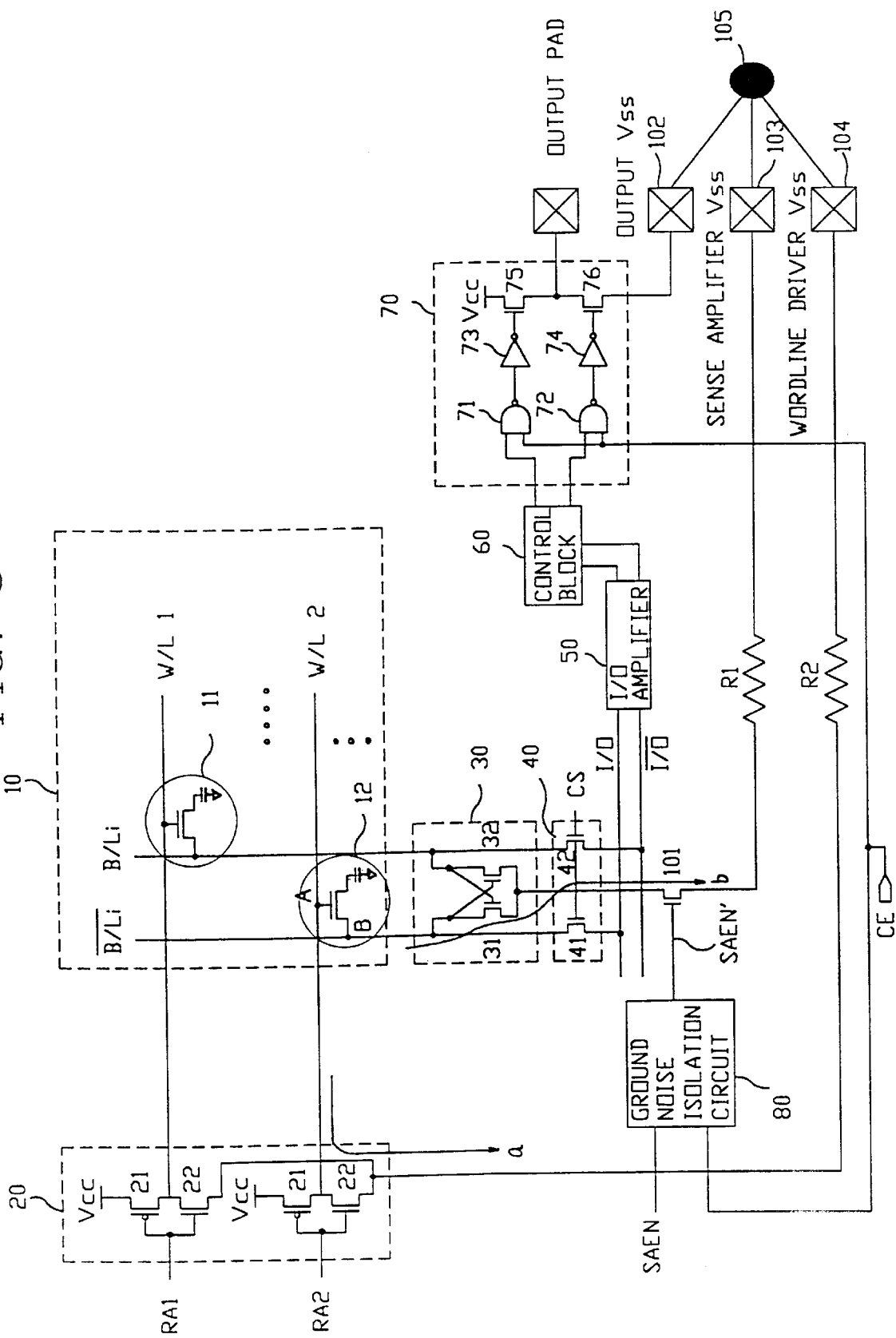
FIG. 3 is a circuit diagram of a semiconductor memory device having a ground noise isolation circuit according to the present invention.

FIG. 3 is a circuit diagram of a ground noise isolation circuit of a semiconductor memory device according to the present invention. As shown therein, there is provided a ground noise isolation circuit 80 for receiving a sense amplifier enable signal SAEN and a chip enable signal CE. In response, the ground noise isolation circuit 10 generates another sense amplifier enable signal SAEN having a pulse width wide enough for compensating the ground bouncing, and controlling a sense amplifier driving transistor 101.

The ground noise isolation circuit 80, as shown in FIG. 4, includes a pulse generator 81 for generating a pulse signal having a predetermined width upon receiving the chip enable signal CE, a NAND-gate 82 for NANDing the pulse signal generated by the pulse generator 81 and the sense amplifier enable signal SAEN, and an inverter 83 for inverting the output of the NAND-gate 82 and outputting the other sense amplifier enable signal SAEN. The pulse generator 81 includes a plurality of serially connected delay elements, preferably three inverters for sequentially inverting the chip enable signal CE and a NAND-gate for NANDing the output of the inverters and the chip enable signal CE. The number of inverter is (2n+1) number of inverters, where n≧0.

When row address signals RA1 and RA2 are inputted, and the PMOS transistor 21 and the NMOS transistor 22 of the word line driver 20 are turned on/off, and a specific word line W/L among the plurality of word lines is selected. When the word line W/L1 is selected, data outputted from the memory cell 11 of the word line W/L1 is carried on the bit line B/Li, and the ground noise isolation circuit 80 outputs the sense amplifier enable signal SAEN' which is the same as the sense amplifier enable signal SAEN in the related art circuit until the chip enable signal CE is activated to the high level, and the sense amplifier driving transistor 101 is turned on.

The bit line sense amplifier 30 amplifies the data carried on the bit line B/Li and outputs the amplified data signals to the input/output lines I/O and /I/O through the column switch 40 which is turned on in accordance with the column selection signal CS. The data carried on the input/output lines I/O and /I/O are amplified by the I/O amplifier 50, and are inputted to the data output unit 70 through the control block 60.

When the chip enable signal CE becomes a high level, as shown in FIG. 5C, the NAND-gates 71 and 72 of the data output unit 70 NAND the chip enable signal CE of a high level and the data outputted from the control block 60. The inverters 73 and 74 output high and low level signals, respectively, to the gates of the NMOS transistors 75 and 76, so that the NMOS transistor 75 is turned off and the NMOS transistor 76 is turned on.

The output of the data output unit 70, as shown in FIG. 5E, is quickly ground-bounced, and the ground bouncing induces another ground bouncing of the ground combining line 105 through the ground line 102. In addition, the ground bouncing of the ground combining line 105 causes another ground bouncing to occur in the sense amplifier ground line 103 and the word line driver ground line 104.

Thereafter, the ground bouncing noise generated in the sense amplifier ground line 103 and the word line driver ground line 104 are inputted to the bit line sense amplifier 30 and the word line driver 20 at a time difference in accordance with the resistance difference between the resistors R1 and R2.

However, when the chip enable signal CE, as shown in FIG. 5C, becomes a high level, the ground noise isolation circuit 80 outputs a pulse signal of a low level having a predetermined width wide enough for compensating the ground bouncing, as shown in FIG. 5D. The sense amplifier driving transistor 101 is turned off, and the path transferring the ground bouncing to the bit line sense amplifier 30 is disconnected.

The width is determined by the size and number of the pulse generators 81 and the inverters of the pulse generator 81. In addition, the width of the pulse is preferably as wide as width of the ground noise. As shown in FIGS. 5B and 5G, the ground bouncing at the bit line /B/Li at the node "B" is eliminated by maintaining the off-state of the memory cell 12 to prevent the damaging of the data of the memory cell.

As described above, the present invention is directed to avoiding the influence of the ground bouncing by receiving the chip enable signal which controls the output of the data output unit when the output data of the data unit is changed from the high level to the low level, generating a pulse signal having a predetermined width enough for compensating the ground bouncing, and disconnecting the sense amplifier driving transistor, thus preventing the damaging of the data of the memory cell.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. In a semiconductor memory device, wherein data outputted from a selected memory cell is inputted to a data output unit through a bit line sense amplifier, a column switch, a sense amplifier driving transistor, an I/O amplifier and a control block, and when a ground bouncing noise occurs in the output of the data output unit, the ground bouncing noise is transferred to a bit line through the sense amplifier driving transistor and the bit line sense amplifier, the improvement comprising:

a ground noise isolation circuit for receiving a sense amplifier enable signal and a chip enable signal, both of which are externally inputted, and generating a pulse signal which compensates the ground bouncing noise by turning off the sense amplifier driving transistor to prevent the ground bouncing noise caused by data transition from a first level to a second level.

2. The circuit of claim 1, wherein said ground noise isolation circuit includes:

a pulse generator for receiving the chip enable signal and for generating a pulse signal having a predetermined width that is larger than a width of a ground noise signal;

a first logic-gate for performing a logical operation on the pulse signal generated by the pulse generator and a first sense amplifier enable signal; and an inverter for inverting an output of the first logic-gate and for outputting a second sense amplifier enable signal.

3. The circuit of claim 2, wherein said pulse generator includes:

(2n+1) number of inverters connected in series for receiving and sequentially inverting the chip enable signal, and outputting the inverted chip enable signal where $n \geq 0$; and a second logic-gate for performing a logical operation on the inverted chip enable signal and the chip enable signal for outputting the pulse signal.

4. The circuit of claim 1 wherein the pulse signal is generated for a first prescribed period of time which is at least equal to a second prescribed period of time that the ground bouncing noise is generated.

5. The circuit of claim 1, wherein said pulse signal is generated after a prescribed period of time the data transits from the first level to the second level.

6. The circuit of claim 5, wherein the prescribed period of time is about immediately after the data transition.

7. The circuit of claim 5, wherein the first and second levels are high and low potentials, respectively.

8. A method of isolating ground noise in a semiconductor memory device comprising a plurality of memory cells, a data output unit, a bit line sense amplifier, a column switch, a sense amplifier driving transistor, an I/O amplifier and a control block, the method comprising the steps of:

detecting a ground bouncing noise signal caused by data transition from a first level to a second level being transferred to a bit line via the sense amplifier driving transistor and the bit line sense amplifier; and controlling the data output unit and the sense amplifier driving transistor by receiving a sense amplifier enable signal and a chip enable signal, to prevent the ground bouncing noise signal from effecting data being output from the memory cells.

9. The method of to claim 4, wherein the step of controlling the data output unit and the sense amplifier driving transistor comprises:

turning off the sense amplifier driving transistor by applying a pulse signal for compensating the ground bouncing noise signal.

10. The method of claim 9, wherein the pulse signal has a predetermined width that is larger than a width of the ground bouncing noise signal.

11. A memory device, comprising:

a memory cell array having a plurality of bit lines and word lines and a plurality of memory cells, each cell being coupled to a corresponding word line and a corresponding bit line;

a plurality of word line drivers coupled to said plurality of word lines;

means for outputting data from a memory cell selected by a corresponding word line from a corresponding bit line to an output pad;

a transistor coupled to said outputting means and a first prescribed potential line; and a noise isolation circuit coupled to said transistor such that said transistor is not enabled during a potential bouncing noise on the first prescribed potential line caused by data transition from a first level to a second level.

12. The memory device of claim 7, wherein said plurality of word line drivers are coupled to a second prescribed potential line.

13. The memory device of claim 12, wherein said outputting means comprises:
  a sense amplifier coupled to said plurality of bit lines;
  a plurality of column switches coupled to said sense amplifier;
  an input/output amplifier coupled to said plurality of column switches;
  a control block coupled to said input/output amplifier; and
  a data output unit coupled to said control block, the output pad, and a third prescribed potential line.

14. The memory device of claim 13, wherein the first, second and third prescribed potential lines are commonly coupled to a ground potential.

15. The memory device of claim 11, wherein said noise isolation circuit comprises:
  a pulse generator that generates a pulse signal of a prescribed width which is at least as wide as a width of the potential bouncing noise; and
  a first logic gate coupled to said pulse generator to generate a signal which disables said transistor during the occurrence of the potential bouncing noise.

16. The memory device of claim 15, wherein said pulse generator comprises:
  a plurality of delay elements connected in series; and
  a second logic gate coupled to said plurality of delay elements and said first logic gate.

17. The memory device of claim 16, wherein said each of said plurality of delay elements comprises an inverter receiving a first external signal commonly applied to said outputting means.

18. The memory device of claim 15, wherein said first logic gate is a NAND-gate, and further comprising an inverter coupled between said NAND gate and said transistor.

19. The memory device of claim 15, wherein said pulse generator is responsive to a first external signal commonly applied to said outputting means, and said first logic gate is coupled to receive a second external signal.

20. A circuit for preventing a noise from corrupting data from a semiconductor memory cell, comprising:
  a plurality of delay elements connected in series; and
  a first logic gate coupled to said plurality of delay elements and commonly receiving a first signal; and
  a second logic gate coupled to said first logic gate and responsive to a second signal such that a pulse signal having a prescribed width which is at least as wide as a width of the noise caused by data transition from a first level to a second level is generated.

21. The memory device of claim 20, wherein said first and second logic gates are NAND-gates, and further comprising an inverter coupled said second NAND gate.

22. The memory device of claim 20, wherein said each of said plurality of delay elements comprises an inverter.

* * * * *